US007961765B2

(12) United States Patent
Jones

(10) Patent No.: US 7,961,765 B2
(45) Date of Patent: Jun. 14, 2011

(54) NARROW SURFACE CORRUGATED GRATING

(75) Inventor: Richard Jones, San Mateo, CA (US)

(73) Assignee: Intel Corporation, Santa Clara, CA (US)

( * ) Notice: Subject to any disclaimer, the term of this patent is extended or adjusted under 35 U.S.C. 154(b) by 50 days.

(21) Appl. No.: 12/415,932

(22) Filed: Mar. 31, 2009

(65) Prior Publication Data

US 2010/0246617 A1 Sep. 30, 2010

(51) Int. Cl.
H01S 3/10 (2006.01)
(52) U.S. Cl. ............ 372/26; 372/50.11; 372/64; 372/99
(58) Field of Classification Search ................... 372/26, 372/50.11, 99
See application file for complete search history.

(56) References Cited

U.S. PATENT DOCUMENTS

| 4,852,960 | A | * | 8/1989 | Alferness et al. ............ 385/37 |
| 2002/0126942 | A1 | * | 9/2002 | Evans ............................. 385/14 |
| 2008/0002929 | A1 | | 1/2008 | Bowers et al. | |

OTHER PUBLICATIONS

"A Broadband Reflector for Waveguides", http://www.priorartdatabase.com/IPCOM/000151878/, retrieved Mar. 23, 2009, (Apr. 23, 2007), 1-3.

Fang, Alexander W., et al., "A Distributed Bragg Reflector Silicon Evanescent Laser", IEEE Photonics Technology Letters, vol. 20, No. 20, (Oct. 15, 2008), 1667-1669.
Fang, Alexander W., et al., "A distributed feedback silicon evanescent laser", Optics Express, vol. 16, No. 7, (Mar. 31, 2008), 4413-4419.
Hastings, J T., et al., "Optical waveguides with apodized sidewall gratings via spatial-phase-locked electron-beam lithography", J. Vac. Sci Technology B, 20(6), (Nov. 2002), 2753-2757.
Murphy, Thomas E., "Fabrication and Characterization of Narrow-Band Bragg-Reflection Filters in Silicon-on-Insulator Ridge Waveguides", Journal of Lightwave Technology, IEEE 2001, 1938-1942.
Wiesmann, D., et al., "Apodized Surface-Corrugated Gratings with Varying Duty Cycles", IEEE Photonics Technology Letters, vol. 12, No. 6, (Jun. 2000), 639-641.
Garidel, Sophie, et al., "Apodized filters on InP-material ridge waveguides using sampled Bragg gratings", Optical Components and Materials II, Proceedings of SPIE, vol. 5723, (2005), 121-130.

* cited by examiner

Primary Examiner — Dung T Nguyen
(74) Attorney, Agent, or Firm — Blakely, Sokoloff, Taylor & Zafman LLP

(57) ABSTRACT

Narrow surface corrugated gratings for integrated optical components and their method of manufacture. An embodiment includes a grating having a width narrower than a width of the waveguide on which the grating is formed. In accordance with certain embodiments of the present invention, masked photolithography is employed to form narrowed gratings having a desired grating strength. In an embodiment, an optical cavity of a laser is formed with a reflector grating having a width narrower than a width of the waveguide. In another embodiment an integrated optical communication system includes one or more narrow surface corrugated gratings.

12 Claims, 9 Drawing Sheets

NARROW SURFACE CORRUGATED GRATING

TECHNICAL FIELD

Embodiments of the present invention are in the field of integrated optical components (IOC) and more specifically pertain to surface corrugated gratings.

BACKGROUND

Communications networks continue to grow in breadth of coverage and data density. An important enabling technology of this continued growth is increased integration of optical (photonic) components. For example, metropolitan area networks and wide area networks are now being deployed with wavelength division multiplexing (WDM) which add/drop channels using wavelength selective filters integrated onto silicon, or other semiconductor, substrates using very large scale integration (VLSI) manufacturing techniques.

In optical communication there are many applications in addition to wave-length selective filters which to at least some extent utilize a Bragg grating, such as lasers (e.g., distributed Bragg reflector (DBR) laser or distributed feedback (DFB) lasers), grating-assisted couplers, and dispersion compensators to name only a few. One type of integrated Bragg grating, typically referred to a "corrugated grating" is formed by physically corrugating a surface of a waveguide (e.g., planar or rib/ridge waveguides) patterned into a thin film over a substrate. For a first-order corrugated grating to be operative at the 1550 nm wavelength, the grating period, or "tooth" pitch is between about 200 nm and 250 nm. This relatively small feature pitch leaves little latitude for tuning the grating strength ($\kappa$) using VLSI manufacturing techniques.

BRIEF DESCRIPTION OF THE DRAWINGS

Embodiments of the present invention are illustrated by way of example, and not limitation, in the figures of the accompanying drawings, in which.

DETAILED DESCRIPTION

Embodiments of narrow surface corrugated gratings, their manufacture and application in integrated optical components are described herein with reference to figures. As referred to herein, a surface corrugated grating is "narrow" where the grating width is narrower than the width of waveguide on which the grating is formed.

Particular embodiments described herein may be practiced without one or more of these specific details, or in combination with other known methods, materials, and apparatuses. For example, while a grating mirror is described in the context of silicon-based DBR and DFB lasers, a narrow surface corrugated grating and the techniques described herein may be readily adapted to other integrated optical components, such as, but not limited to optical add/drop filters, signal conditioners, etc. In the following description, numerous specific details are set forth, such as specific materials, dimensions and material parameters etc. to provide a thorough understanding of embodiments of the present invention. In other instances, well-known optical design and VLSI fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, appearances of the phrase "in an embodiment" in various places throughout this specification are not necessarily referring to the same embodiment of the invention. Furthermore, the particular features, structures, materials, or characteristics may be combined in any suitable manner in one or more embodiments. It should also be understood that specific embodiments may be combined where not mutually exclusive.

The terms "over," "under," "between," and "on" as used herein refer to a relative position of one member with respect to other members. As such, for example, one member disposed over or under another member may be directly in contact with the other member or may have one or more intervening members. Moreover, one member disposed between members may be directly in contact with the two members or may have one or more intervening members. In contrast, a first member "on" a second member is in intimate contact with that second member. Additionally, the relative position of one member with respect to other members is provided assuming operations are performed relative to a substrate common to the members without consideration of the absolute orientation of the substrate or members.

Figure 1A:
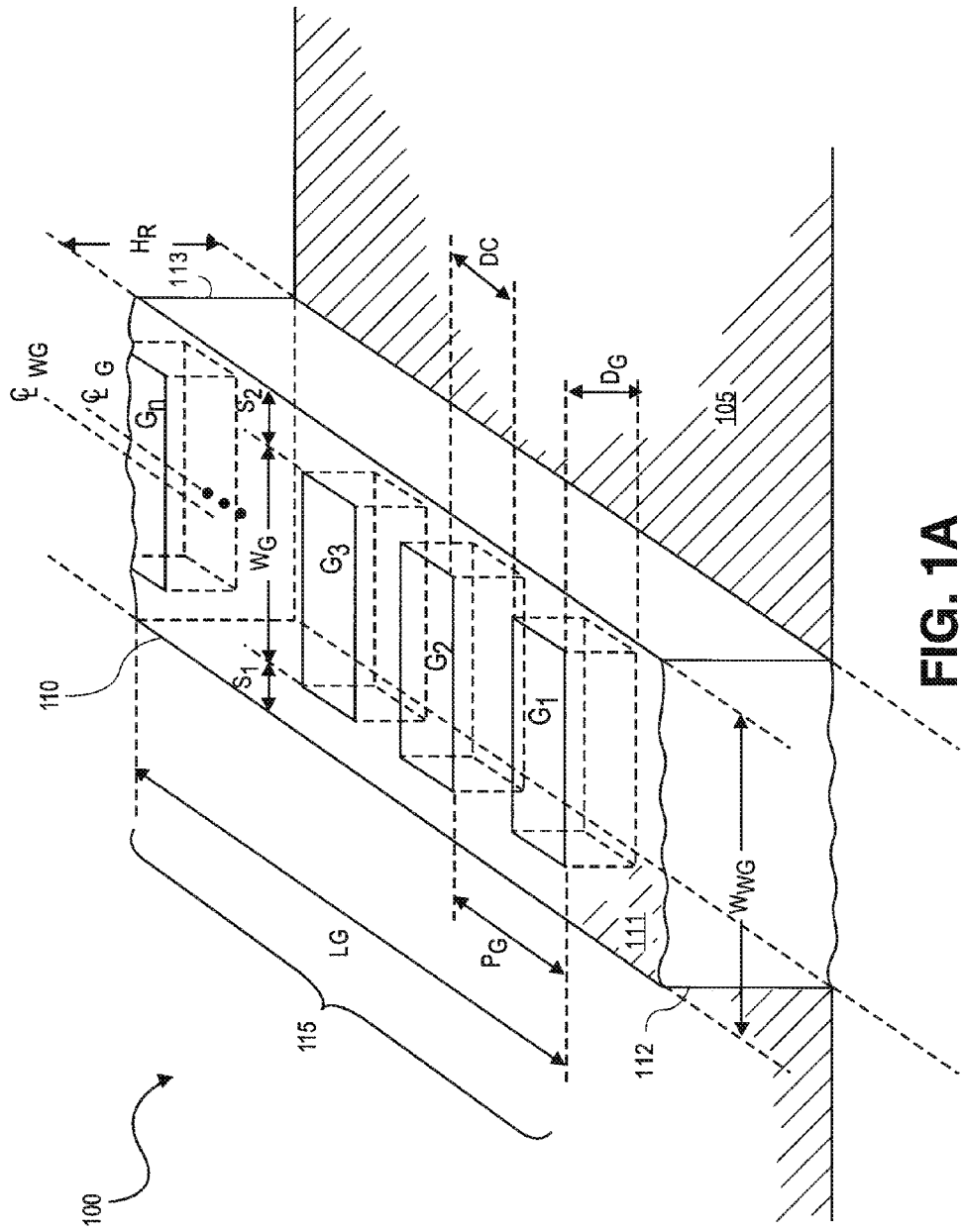
FIG. 1A illustrates an isometric view of a corrugated surface grating, in accordance with an embodiment.

Referring to FIG. 1A, an isometric view of an exemplary narrow surface corrugated grating 100 is depicted. The narrow surface corrugated grating 100 includes a grating 115 formed by corrugating a portion of waveguide 110 over a substrate 105. The waveguide 110 has a top surface 111 which has a width $W_{WG}$ as defined by a first waveguide sidewall 112 and a second waveguide sidewall 113 further defining the rib or ridge height $H_R$. Because the waveguide sidewalls 112 and 113 may not be precisely vertical (i.e. orthogonal to the top surface 111), the width $W_{WG}$ of the top surface 111 is used herein as the waveguide width. In a particular embodiment, the width $W_{WG}$ is between approximately 0.3 and 2.5 µm and the rib height $H_R$ is between approximately 0.2 µm and 2 µm. Typically, a grating will be formed in a portion or region of a waveguide which has a constant waveguide width, as depicted in FIG. 1A. However, in alternative embodiments, a narrow surface corrugated grating is formed in a tapered portion of a waveguide.

Narrow corrugated surface gratings are generally applicable to any material system known in the art for corrugated surface gratings. For example, substrate 105 may be composed of any material suitable for integrated optical component fabrication. In one embodiment, substrate 105 is a bulk substrate composed of a single crystal of a material which may include, but is not limited to, silicon or a III-V compound semiconductor material, such as indium phosphide (InP). In another embodiment, substrate 105 includes a bulk layer with a top epitaxial layer formed over the bulk layer. In a specific embodiment, the bulk layer is composed of a single crystalline material which may include, but is not limited to, silicon or a III-V compound semiconductor material, while the top epitaxial layer is composed of a single crystalline layer which may include, but is not limited to, silicon or a III-V compound semiconductor material. In another embodiment, the top epitaxial layer is separated from the bulk layer by an intervening insulator layer, such as silicon dioxide, silicon nitride and silicon oxy-nitride (e.g. to form a silicon-on-insulator substrate). The waveguide 110 may be, for example, any of those materials described as candidates for the substrate 105 or may be others known in the art, such as polymers (SU-8, etc.).

The grating 115 includes a plurality of grooves including grooves $G_1, G_2, G_3$ through $G_n$ formed into the waveguide top surface 111 along a grating length, $L_G$. The grooves $G_1$-$G_n$ corrugate the top surface 111 of the waveguide 110 resulting in periodic arrangement of grooves and "teeth" or "ridges" between the grooves forming a Bragg grating to modulate the index of refraction in a portion of the waveguide 110. The grooves $G_1$-$G_n$ have a grating pitch or period, $P_G$, which, depending on embodiment, can be uniform or graded, and either localized or distributed in a superstructure. Certain embodiments of narrow gratings may also be tilted such that the grooves $G_1$-$G_n$ are tilted from the orientation depicted in FIG. 1A (i.e., grooves are non-orthogonal to the length of the waveguide). The grooves $G_1$-$G_n$ have a corrugation depth $D_G$ which is generally significantly less than the rib height $H_R$, with deeper groove depths increasing grating strength. In one embodiment where the grating is formed in a silicon waveguide having a width of between approximately 1-1.5 μm and a rib height $H_R$ of approximately 0.5 μm the depth $D_G$ is between approximately 10-300 nm.

As further shown in FIG. 1A, the grooves $G_1$-$G_n$ have a length dimension defining a grating duty cycle, DC based on the grating period, $P_G$. The grating duty cycle is the ratio of the space between grooves (i.e. ridge length) and the grating period and is therefore a function of the smallest groove spacing and the smallest groove dimension (i.e. groove length) achievable for a given patterning method. The grating duty cycle decreases as the groove to tooth length ratio becomes larger for a particular grating pitch $P_G$. For example, a grating duty cycle is 50% where a groove has a length equal to that of a tooth and for a grating pitch of 240 nm and a 150 nm groove length (90 nm tooth) provides a duty cycle of 37.5% while a 90 nm groove length provides a duty cycle of 62.5%. In one particular embodiment where a grating is formed in a silicon waveguide having a width of approximately 1-1.5 μm and a rib height $H_R$ of approximately 0.5 μm, the grating corrugation depth $D_G$ is approximately 10-300 nm while the grating length $L_G$ is approximately 1-200 μm and the plurality of grooves has a pitch (i.e., grating period $P_G$) of approximately 190-250 nm. This exemplary embodiment is well suited for integrated optical waveguide applications in telecommunications utilizing a 1550 nm nominal wavelength.

Figure 1B:
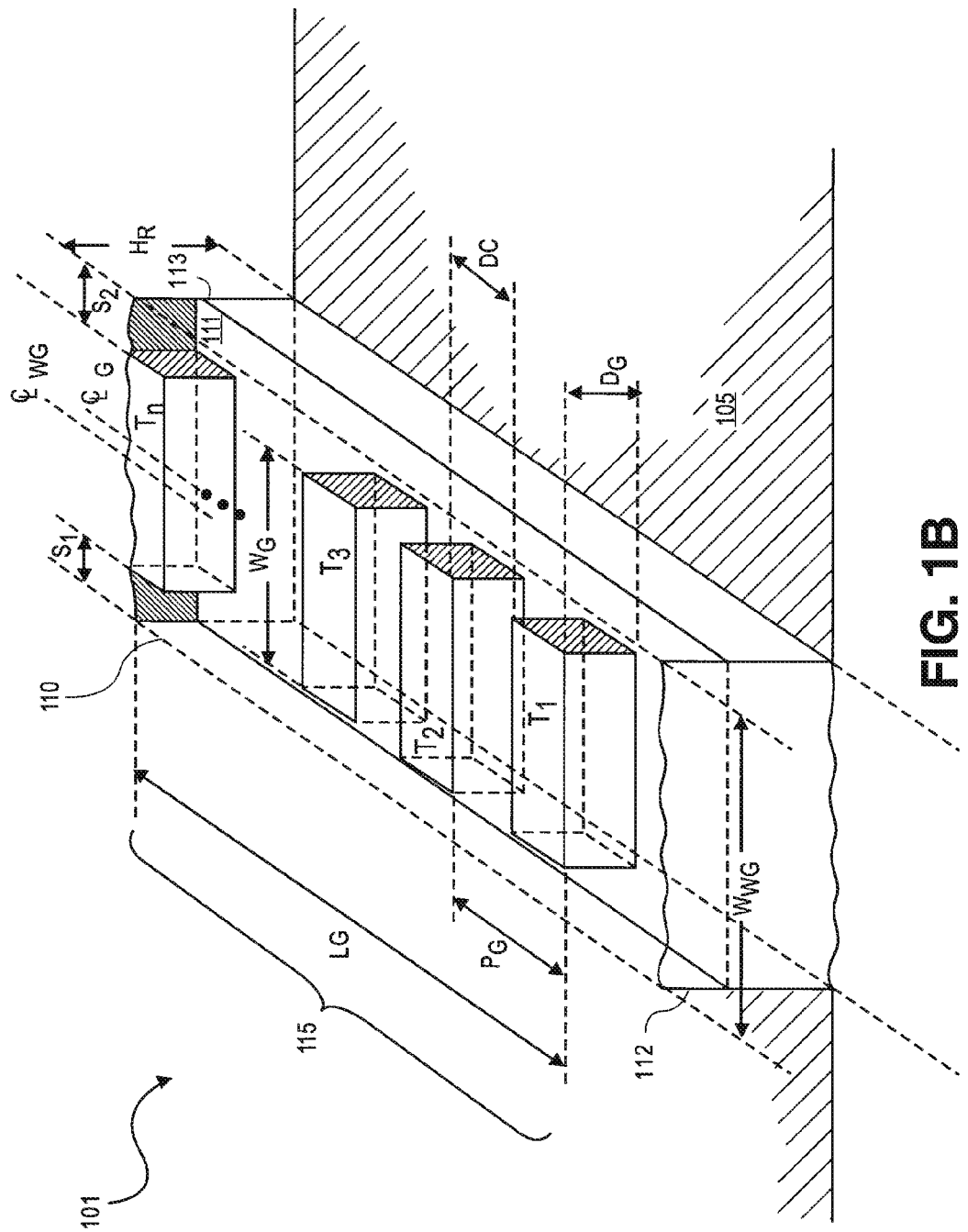
FIG. 1B illustrates an isometric view of a corrugated surface grating, in accordance with an embodiment.

In embodiments, at least one of the grooves $G_1$-$G_n$ has a width narrower than the waveguide width. In the exemplary narrow corrugated surface grating 100, each of the plurality of grooves has a width $W_G$ narrower than the waveguide width, $W_{WG}$. Generally, to achieve a reduction in grating strength, substantially all of the grooves $G_1$-$G_n$ are to have a width narrower than that of the waveguide. However, one or more of the grooves $G_1$-$G_n$ may have a width $W_G$ equal to the waveguide width without departing from the spirit of a narrow corrugated surface grating as long as the number of the grooves $G_1$-$G_n$ which are narrower than the waveguide width is sufficient to achieve an appreciable reduction in grating strength. In particular embodiments therefore, at least 95% of the grooves in a narrow grating are of a width narrower than the waveguide. In further embodiments, the width of a majority of the grooves is narrower than the width of the waveguide by approximately the same amount (i.e. a majority have a same width). In a particular embodiment, as depicted in FIGS. 1A and 1B, all (or substantially all) of the grating grooves $G_1$-$G_n$ or grating teeth $T_1$-$T_n$, respectively, have approximately the same narrowed width along the grating length $L_G$.

In embodiments, a narrow surface corrugated grating includes at least one groove of a width less than or equal to 90% of the waveguide width. Thus, for an exemplary waveguide that is approximately 1.5 μm wide, a narrow surface corrugated grating would have a grating width less than about 1.35 μm. In a further embodiment, a narrow surface corrugated grating includes at least one groove of a width at least 5% of the waveguide width but no greater than 90% of the waveguide width $W_{WG}$. Thus, for an exemplary waveguide that is approximately 1.5 μm wide, a narrow surface corrugated grating would have a grating width between about 75 nm and 1.35 μm.

Figure 2:
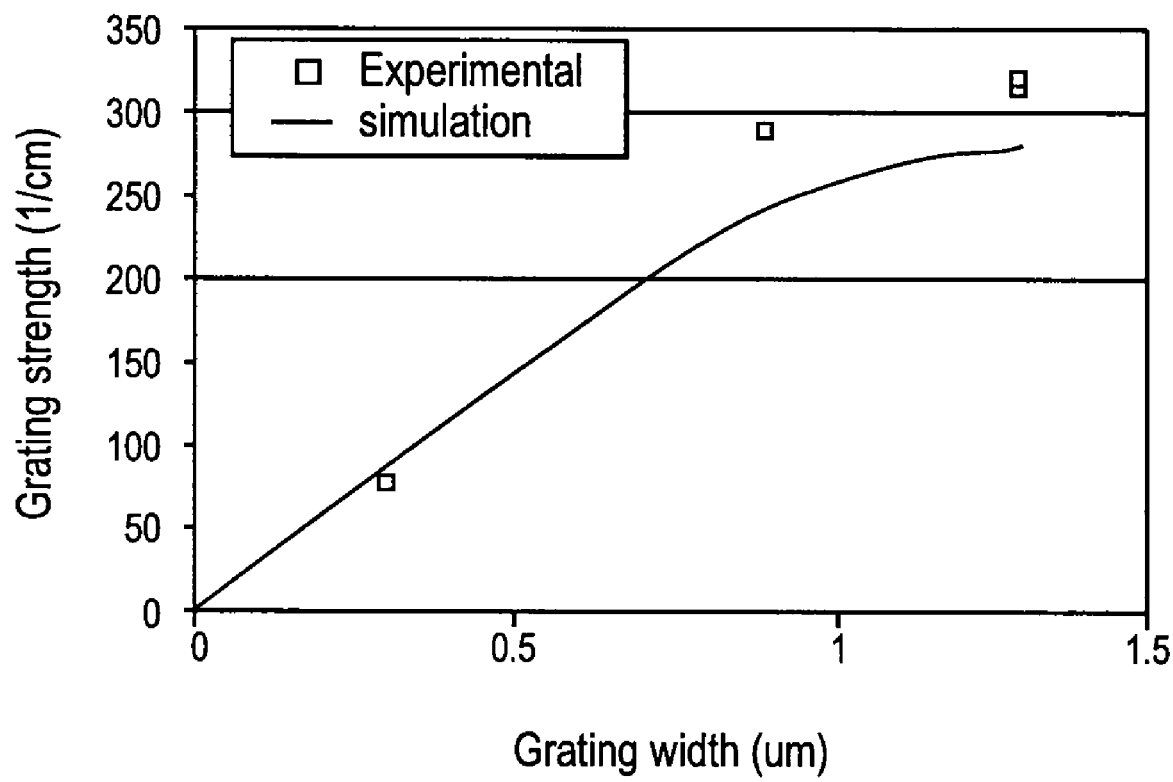
FIG. 2 illustrates a graph of grating strength as a function of grating width for a constant waveguide width, in accordance with embodiments.

Narrowing the grating width to be less than the waveguide width allows the grating strength κ to be controlled. Hence, the reflectivity and bandwidth may also be controlled as a function of grating width to provide an additional degree of freedom in the design and formation of a surface corrugated grating. The reflectivity R of the grating is approximated in Equation 1, as $$R \approx \tan h^2(\kappa L), \quad (1)$$

where L is the grating length (e.g., $L_G$ in FIG. 1A). Experimental and field simulation data for a narrow surface corrugated grating are depicted in FIG. 2. As shown, the grating strength κ for a grating patterned on a 1.5 μm wide waveguide is modeled as a function of grating width. The grating strength was experimentally determined for grating widths between 1.3 μm and 0.3 μm, with the grating strength reduced from 320 $cm^{-1}$ for the 1.3 μm grating width to 78 $cm^{-1}$ for the 0.3 μm grating width.

Referring back to FIG. 1A, setting the width of the grating to control the grating strength κ has the benefit of being independent of the grating pitch $P_G$ or grating depth $D_G$ which are each dimensionally much smaller than the waveguide width $W_{WG}$. Thus, the resolution of the grating patterning method does not pose the same limitations as it does if the grating strength is modulated by varying the grating duty cycle, for example. In certain applications, grating depth may be so small, potentially on the order of tens of nanometers, that the groove etch becomes quite difficult to controllably manufacture. Narrowed grating grooves, having reduced grating strength relative to full width grooves, however can be etched to a relatively greater depth, for example 2-3 times deeper, to achieve a particular grating strength. Thus, additional groove etch process latitude and controllability is available with the narrow surface corrugated gratings described herein. Also, because grating depth is typically difficult to vary between gratings on a same substrate, a relatively larger grating depth may be provide for all gratings to achieve a first grating of maximum grating strength which can then be reduced on a grating specific basis by narrowing the grating width for other gratings on the substrate. For these reasons, a large range of grating strength κ may be achieved by a narrow corrugated surface grating for a given grating length.

As further depicted in FIG. 1A, the grating 115 has a longitudinal centerline approximately aligned with the longitudinal centerline of the waveguide 110, leaving spaces $S_1$ and $S_2$ between the grooves and the waveguide sidewalls 112 and 113. In the exemplary embodiment depicted, the dimension of $S_1$ is approximately equal to that of $S_2$ as a result of the centerline alignment and the constant grating width along the grating length, but it is understood that a certain amount of misalignment between the longitudinal centerlines of the waveguide and grating is to be expected as a function of the method of manufacturing employed and the tolerances of the particular equipment carrying out that method. Generally, it has been found that the sensitivity to misalignment between the longitudinal centerlines of the grating and waveguide is inversely proportional to the grating width $W_G$.

FIG. 1B depicts an embodiment of a narrow surface corrugated grating as an alternative to the embodiment illustrated in FIG. 1A. In this alternative embodiment, the narrow surface corrugated grating 101 includes grating teeth, $T_1$-$T_n$ having a width narrower than the waveguide width $W_{WG}$. As depicted, a contiguous portion of waveguide is removed to define the grating teeth $T_1$-$T_n$ and thereby form the spaces $S_1$ and $S_2$ along the entire grating length $L_G$. The spaces $S_1$ and $S_2$ are then to be substantially filled with a suitable cladding material along with the grooves between the teeth $T_1$-$T_n$, just as the grooves $G_1$-$G_n$ are for the embodiment of FIG. 1A. Depending on the grating pitch $P_G$ and duty cycle DC, a cladding fill around the free-standing grating teeth $T_1$-$T_n$ may be superior to a cladding fill in the grooves $G_1$-$G_n$ of FIG. 1A. The remaining features of the narrow surface corrugated grating 101 depicted in FIG. 1B are substantially the same as those of the narrow surface corrugated grating 100 depicted in FIG. 1A.

In a further embodiment, the grating width varies as a function of grating length such that the widths of each groove in the plurality of grooves making up the surface corrugated grating are not all equal. Such a grating architecture allows the grating strength to be varied along the grating length to provide an apodized narrow surface-corrugated grating capable of reducing side-lobe strength. Such grating width apodization can be used to change the reflectivity and bandwidth of the grating to reduce insertion loss and/or smooth the transmission spectra. Modulation of the grating width $W_G$ may provide apodization of any type, such as, but not limited to Gaussian and raised-cosine.

Figure 3:
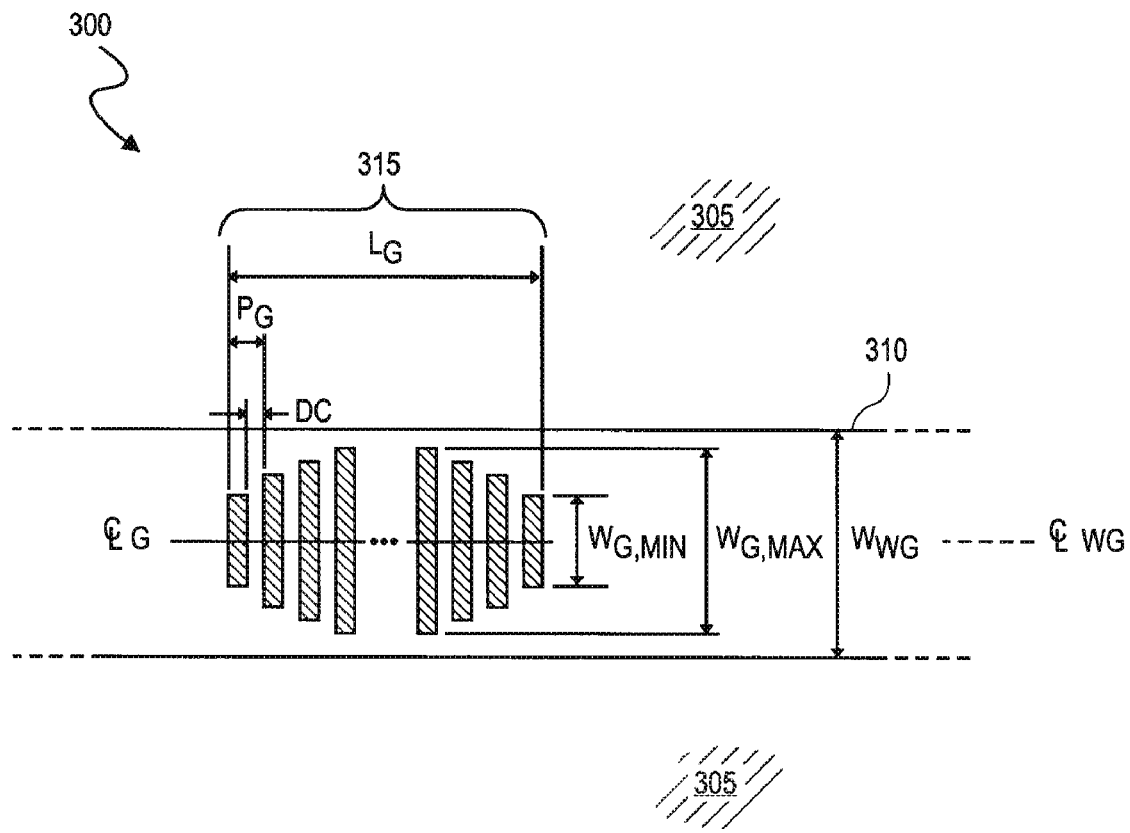
FIG. 3 illustrates a plan view of a corrugated surface grating, in accordance with an embodiment.

FIG. 3 illustrates a plan view of one embodiment of a grating width apodized surface-corrugated grating 300. As shown, a grating 315 is formed on a waveguide 310 over a substrate 305. The grating width $W_G$ varies from $W_{G, MIN}$ to $W_{G, MAX}$ along the grating length $L_G$. Although the grating width $W_G$ of every portion of the grating is less than the waveguide width $W_{WG}$ in the exemplary embodiment depicted in FIG. 3, in other embodiments some subset of the grooves making up the grating may have a width equal to the waveguide width $W_{WG}$.

Figure 4A:
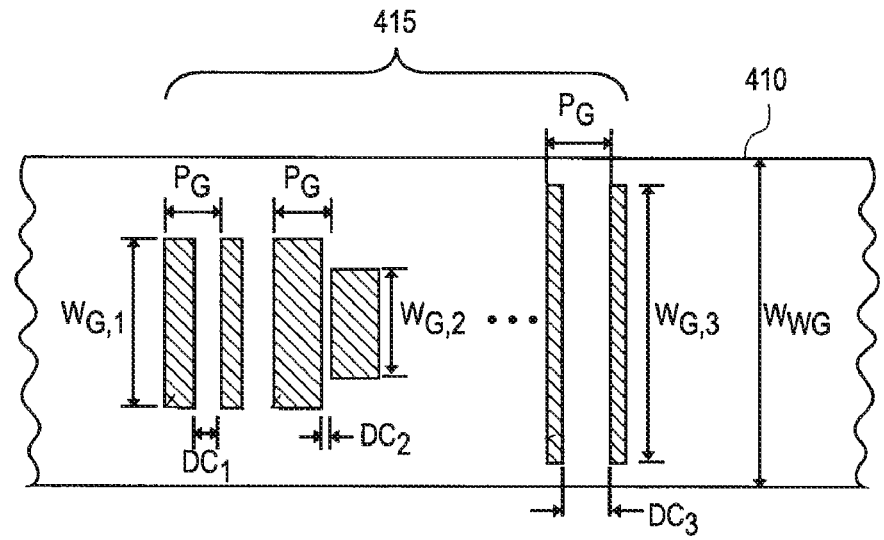
FIG. 4A illustrates a plan view of a corrugated surface grating, in accordance with an embodiment.

In the embodiment depicted in FIG. 3, the grating pitch and duty cycle DC remain constant over the grating length $L_G$. In other embodiments, however, both duty cycle DC and grating width $W_G$ may be varied over the grating length $L_G$ to potentially provide greater coupling-coefficient variation that would be possible through either width or duty cycle modulation may achieve alone. FIG. 4A depicts a waveguide 410, a portion of which contains the grating 415. The grating 415 has a constant grating pitch $P_G$ while the width of the grating varies from $W_{G,1}$ to $W_{G,2}$ to $W_{G,3}$ along the grating length. The grating duty cycle DC also varies from $DC_1$ to $DC_2$ to $DC_3$ along the grating length.

Figure 4B:
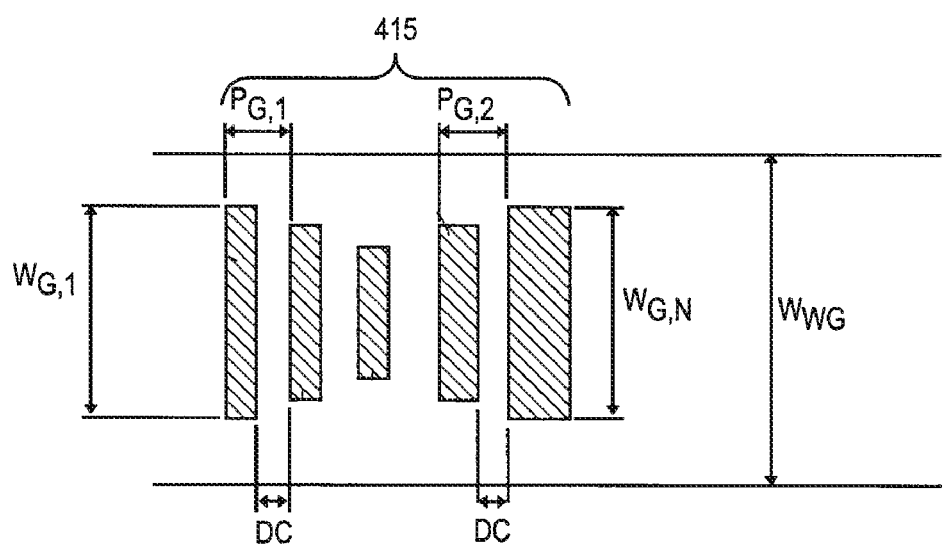
FIG. 4B illustrates a plan view of a corrugated surface grating, in accordance with an embodiment.

In another embodiment, a narrow grating width is utilized in conjunction with a modulated grating period along the length of the grating (e.g., chirped narrow surface corrugated grating). For example, FIG. 4B depicts a grating 415 having a grating width which varies from $W_{G,1}$ to $W_{G,n}$ while the grating period varies from $P_{G,1}$ to $P_{G,2}$. In other embodiments, the grating period is graded in any manner known in the art to control the reflected/transmitted spectrum (e.g., broadening the reflected spectrum) in conjunction with the grating having a fixed width that is less than the width of a waveguide.

In embodiments, the narrow surface corrugated grating described in reference to FIGS. 1-4B is patterned with masked photolithography. Masked photolithography has many advantages over typical methods of patterning gratings, such as holographic (interference) and electron beam patterning techniques. For example, masked photolithography has the advantage of being a widely employed VLSI manufacturing process and this form of lithography offers the ability to form a grating narrower than a typical waveguide along with adequate alignment to the waveguide. Holography techniques, in contrast, generally rely on patterning an interference pattern across very large area (e.g., an entire substrate), while Ebeam writing is a relatively slow process with relatively poorer alignment capability. Use of masked photolithography also enables grating strength to be tuned to different values across a same substrate, thereby allowing grating filters or mirrors to be tuned for different wavelengths between optical components on a same substrate or even between two different portions of the same optical component.

Figure 5:
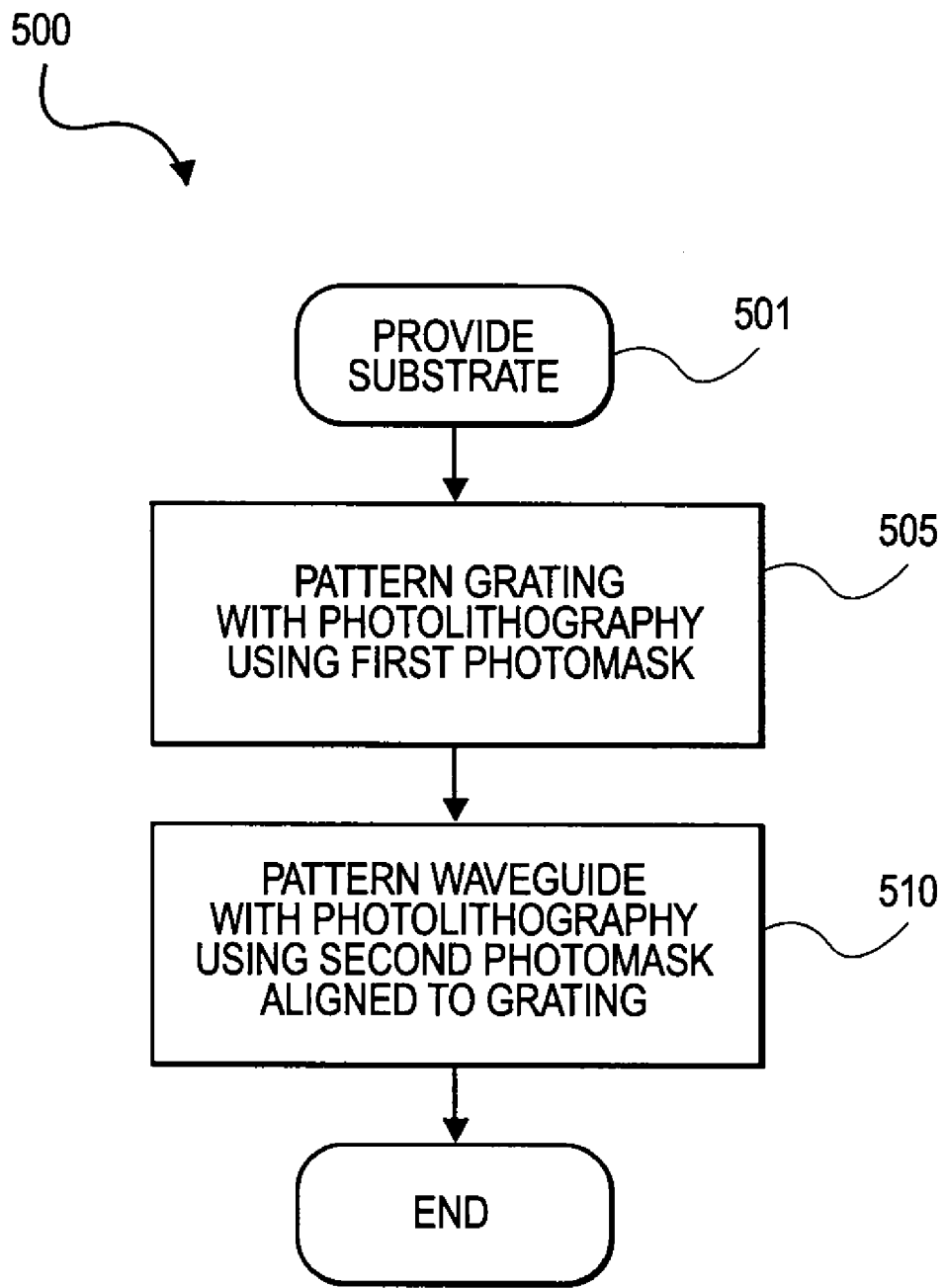
FIGS. 5 is a flow diagram of a method of forming a corrugated surface grating, in accordance with an embodiment.

FIG. 5 depicts a flow diagram of an exemplary masked photolithography method 500 of forming a narrow surface corrugated grating. The method 500 begins with provision of a substrate at operation 501, such as any of those described for substrate 105 in FIG. 1A. For example, in one embodiment a silicon-on-insulator substrate is provided.

Next, at operation 505, a grating having a particular length, period and width is patterned in a material layer using a first photomask pattern. The patterning operation 505 may include any convention photolithography process known in the art. However, in one embodiment 193 nm lithography is employed. Steppers at the 193 nm lithography node are capable of printing sufficient minimum feature sizes (e.g., on the order of 90 nm) to print a grating with a sufficient period (e.g., on the order of 200 nm to 250 nm) for an optical waveguide formed in the silicon and designed for the nominal 1550 nm wavelength utilized in optical communication.

Thus, in one embodiment, at operation 505, a SOI substrate is coated with a photosensitive layer and exposed with 193 nm wavelength electromagnetic energy to print into the photosensitive layer a grating pattern based on the first photomask. Depending on the embodiment, the grating pattern may be either one which provides resist openings where narrowed grating grooves are to be etched or resist pillars where narrowed grating teeth are to formed in the substrate. In either case, the first photomask may be a bright field mask (masking only a portion of the grating and an area slightly larger than the waveguide) or a darkfield mask (exposing only a portion of the grating). The photosensitive layer is then developed into an etch mask and the pattern transferred into an underlying intervening hardmask layer or directly into the waveguide layer using any etch process, wet or dry, known in the art. For example, a top silicon layer of an SOI substrate may be etched to transfer the grating pattern of the etch mask into the silicon layer. In some embodiments, a double patterning method is employed to reduce the pitch of the grating below that of the first photomask. Any conventional double patterning method known in the VLSI arts may be employed. In one exemplary embodiment, the exposed pattern is transferred into an underlying etch mask layer, a spacer is formed on either side of the mask layer, the mask layer removed, and the spacer then used as a half pitch mask for the etching a grating into the substrate (e.g., top silicon layer of a SOI substrate).

In the exemplary masked photolithography method 500, a waveguide is then photolithographically patterned with a second photomask at operation 510 after the grating pattern is formed in a layer over, on, or in the substrate (e.g., top silicon layer of an SOI substrate). The second photomask is aligned to the grating pattern to have the waveguide pattern encompass the grating (i.e., waveguide pattern is both longer and also wider than at least some portion of the grating). In one embodiment 193 nm lithography is employed to pattern the waveguide. Steppers at the 193 nm lithography node are capable of aligning the waveguide photomask to the grating photomask with sufficiently small misregistration (e.g., on the order of 100 nm) that a wide range of grating widths can utilized for purposes of controlling the grating strength. In an alternative embodiment, the waveguide may be first patterned and the grating pattern subsequently aligned to the waveguide pattern and printed as the second photomask pattern. However, it is advantageous to pattern the grating prior to patterning the waveguide because the relatively smaller dimensions of the grating are more easily achieved with a flatter substrate surface.

After patterning of both the grating and the waveguide, method 500 is complete and any further conventional processing of the waveguide and/or grating may then be performed. For example, a cladding may be formed around the waveguide and grating, filling the grooves and/or encapsulating the teeth of the grating. Any clad layer material that provides sufficient index contrast, as dependent on the material system utilized for the waveguide, may be employed for the cladding. In one exemplary SOI embodiment, the silicon waveguide uses a silicon dioxide clad layer to cover the waveguide and fill the grating grooves. In an alternated SOI embodiment, SU-8 is utilized as cladding on a silicon waveguide.

The narrow surface corrugated gratings and methods to form such gratings may be applied to a number of optical applications, such as, but not limited to, integrated optical grating filters and integrated optical grating mirrors. Integrated optical grating mirrors may be more specifically utilized to form optical cavities of DFB and DBR lasers.

Figure 6A:
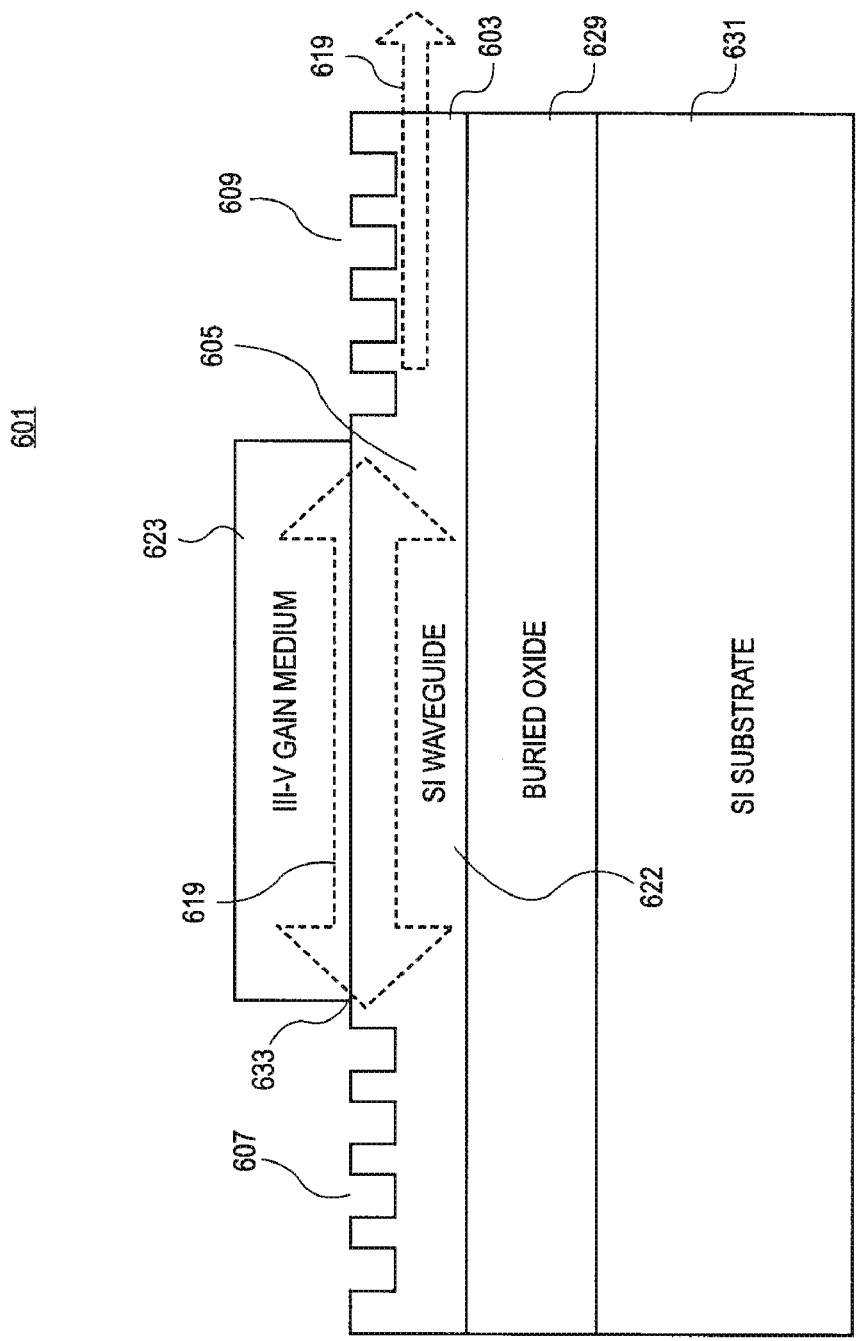
FIG. 6A illustrates a cross-sectional view of a photonic device including a pair of grating mirrors in passive waveguide regions adjacent to an active waveguide region, in accordance with an embodiment.

FIG. 6A illustrates a cross-sectional view showing one embodiment of an electrically pumped hybrid semiconductor evanescent laser employing a least one narrow surface corrugated grating. The depicted cross-section is taken down the longitudinal centerline of the hybrid semiconductor evanescent laser and gratings. As shown, DBR laser 601 is integrated in an SOI substrate including a single crystalline semiconductor layer 603 with a buried oxide layer 629 disposed between the semiconductor layer 603 and a substrate layer 631. In one example, the semiconductor layer 603 and the substrate layer 631 are made of passive silicon. As shown, an optical waveguide 605 is disposed in the semiconductor layer 603 through which an optical beam 619 is directed. In the example illustrated in FIG. 6A, optical waveguide 605 is a rib waveguide, strip waveguide, or the like. An optical cavity 622 forms an active portion of the waveguide between grating reflectors 607 and 609 in a passive portion of the optical waveguide 605 adjacent to either end of the optical cavity 622. As shown in FIG. 6A, reflectors 607 and 609 are Bragg grating reflectors and in a particular embodiment at least one of the reflectors 607 and 609 is a narrow surface corrugated grating having a grating width less than the width of a passive portion of the optical waveguide 605, such as any of those previously described herein.

A III-V gain medium 623 is bonded to or epitaxially grown on "top" of the semiconductor layer 603 across the "top" of and adjoining optical waveguide 605 to provide a gain medium-semiconductor material interface 633. Interface 633 extends along the optical waveguide 605 parallel to the direction of propagation of the optical beam 619. In one example, the gain-medium-semiconductor material interface 633 is an evanescent coupling interface that may include a bonding interface between the active gain medium material 623 and the semiconductor layer 603 of optical waveguide 605. For instance, such a bonding interface may include a thin silicon dioxide layer or other suitable bonding interface material. As one example, the gain medium material 623 is an active III-V gain medium and there is an evanescent optical coupling at the gain medium-semiconductor material interface 633 between the optical waveguide 605 and the gain medium material 623. Depending on the waveguide dimensions of optical waveguide 605, a part of the optical mode of optical beam 619 is inside the III-V gain medium material 623 and a part of the optical mode of optical beam 619 is inside the optical waveguide 605. The gain medium material 623 may be electrically pumped to generate light in the optical cavity 622.

In embodiments, the gain medium material 623 is active semiconductor material such and is III-V semiconductor bar including III-V semiconductor materials such as InP, AlGaInAs, InGaAs, and/or InP/InGaAsP, and/or a suitable material known in the art and their combination at suitable thicknesses and doping concentrations. In one particular embodiment, the gain medium material 623 is an offset multiple quantum well (MQW) region gain chip that is flip chip bonded or wafer bonded or epitaxially grown across the "top" of one or more optical waveguides in the silicon layer of an SOI wafer.

In one embodiment where the gain medium material 623 includes active material, such as MQWs and with passive silicon waveguide based gratings as reflectors or mirrors (at least one of which is a narrow surface corrugated grating), lasing may be obtained within the optical cavity 622. In FIG. 6A, the lasing is shown with optical beam 619 reflected back and forth between reflectors 607 and 609 in optical cavity 622. In the illustrated example, reflector 607 at the "back" side of the laser has a higher power reflectivity than the reflector 609. Reflector 609 is partially reflective such that optical beam 619 is output from a "front" side of the laser into the passive portion of the optical waveguide through which the optical beam 619 may be conducted to other components.

The reflective power of each of reflector 607 and 609 may be tuned based on either or both of grating length and grating strength. In an embodiment, the power reflectivity of each of the reflectors 607 and 609 is tuned independently based on the grating widths of the two reflectors. In one embodiment, both the reflectors 607 and 609 are narrow surface corrugated gratings to tune the grating strength by grating width independently from grating depth. As an example, the reflector 607 is a first narrow surface corrugated grating with a first grating width less than the passive waveguide width while the reflector 609 is a second narrow surface corrugated grating with a second grating width less than the passive waveguide width, the second grating width being the same or different than the first grating width. In one such embodiment, reflector 607 and 609 each have a mirror length between 5 and 500 μm and a grating width is less than 90% of the passive waveguide width which between approximately 1 and 1.5 μm.

In another embodiment, the reflector 609 is a narrow surface corrugated grating with a grating width less than the passive waveguide width while the reflector 607 is a grating with a grating width substantially equal to the passive waveguide width (i.e., only reflector 609 is a narrow surface corrugated grating). In further embodiments, either or both the reflectors 607 and 609 may be an apodized narrow surface-corrugated grating, as described elsewhere herein.

Figure 6B:
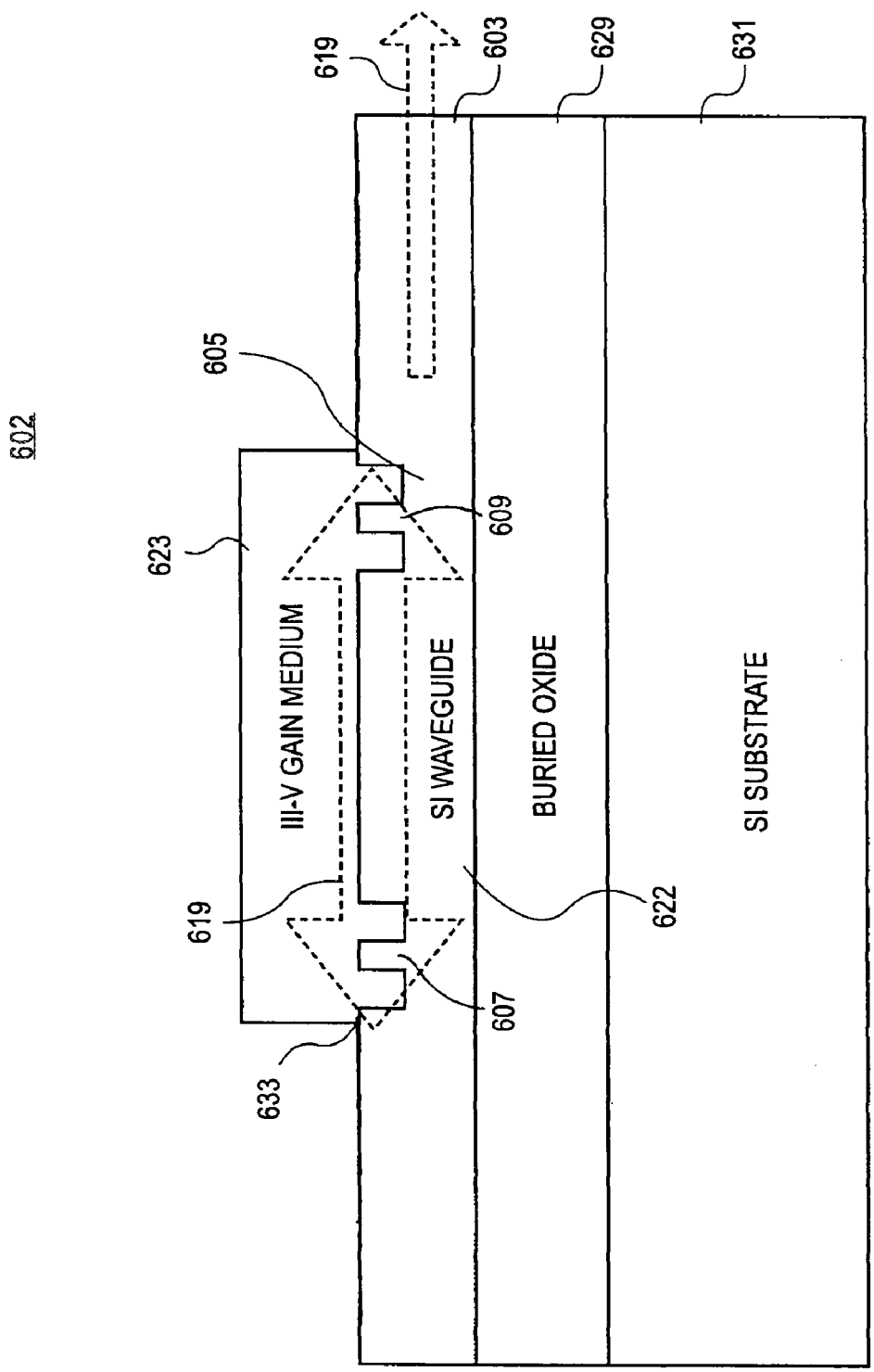
FIG. 6B illustrates a cross-sectional view of a photonic device including a pair of grating mirrors in passive waveguide regions and an active waveguide region, in accordance with an embodiment.

FIG. 6B depicts an alternative embodiment where a DFB laser 602 is integrated in an SOI substrate including a single crystalline semiconductor layer 603 with a buried oxide layer 629 disposed between the semiconductor layer 603 and a substrate layer 631. As further depicted, an optical beam 619 is reflected back and forth between reflectors 607 and 609 within optical cavity 622. In particular embodiments, gratings are employed as reflectors 607 and 609 and these gratings are disposed within the active portion of the silicon waveguide optical cavity 622. In one embodiment, both the reflectors 607 and 609 are narrow surface corrugated gratings for tuning the grating strength by grating width independently of grating depth and grating length. For example, the reflector 607 is a first narrow surface corrugated grating with a first grating width less than the active waveguide width while the reflector 609 is a second narrow surface corrugated grating with a second grating width less than the active waveguide width, the second grating width being either the same or different than the first grating width.

In another embodiment, the reflector 609 is a narrow surface corrugated grating with a grating width less the active waveguide width while the reflector 607 is a grating having a width substantially equal to the active waveguide widths (i.e., only reflector 609 is a narrow surface corrugated grating). In further embodiments, either or both the reflectors 607 and 609 may be an apodized narrow surface-corrugated grating, as described elsewhere herein.

Figure 7:
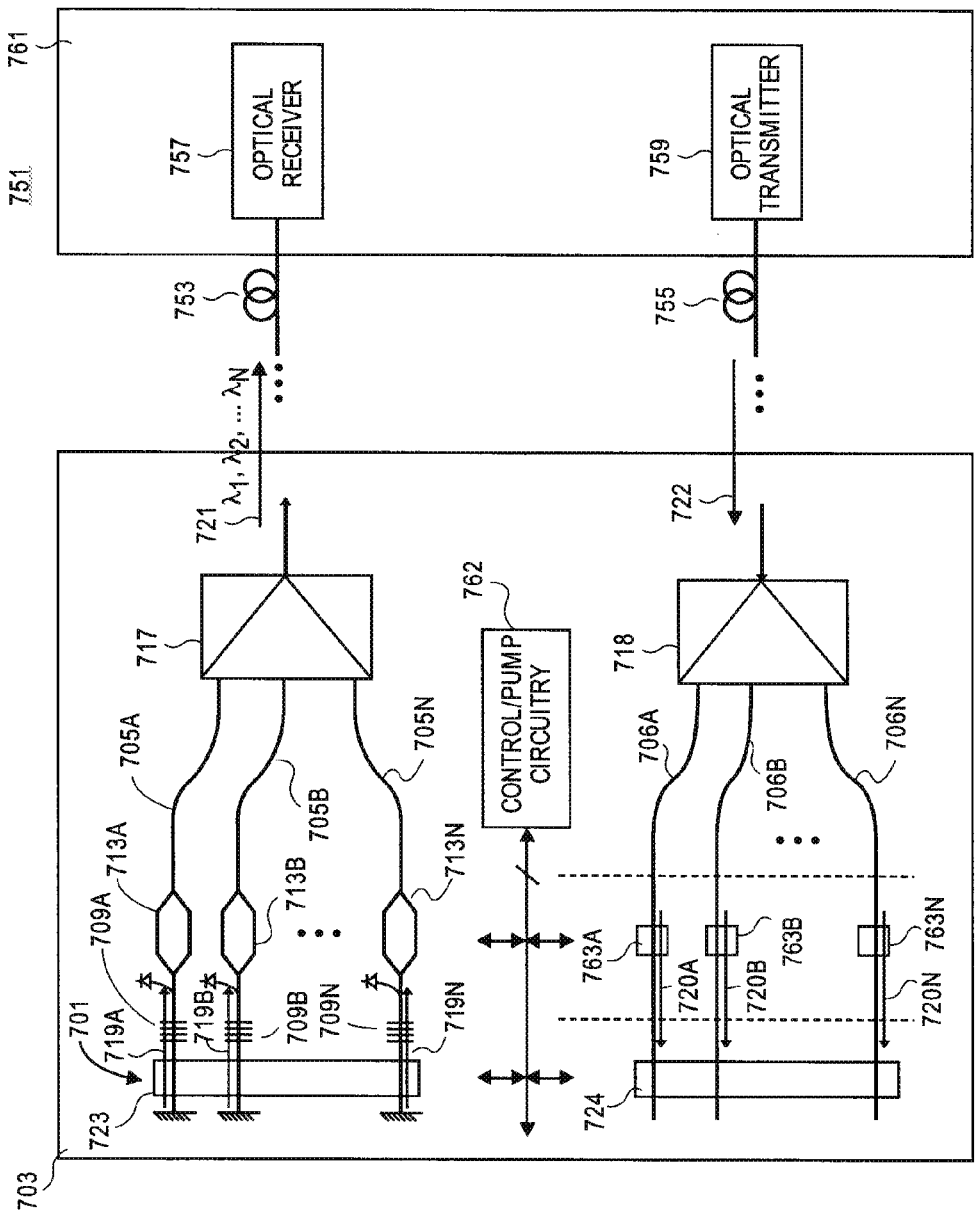
FIG. 7 depicts an optical communication system including a plurality of photonic devices integrated together on a common substrate.

FIG. 7 is an illustration of an exemplary optical system 751 utilizing integrated optical components including an integrated semiconductor modulator multi-wavelength laser having an array of electrically pumped hybrid semiconductor evanescent lasers 701 coupled to a passive semiconductor layer over, on, or in, substrate 703. In one embodiment, each of the lasers in the laser array 701 may be an electrically pumped hybrid silicon evanescent laser substantially as described with reference to FIGS. 6A-6B. In another embodiment, the laser array 701 includes both a DBR laser utilizing a low grating strength and DFB laser utilizing a high grating strength. In the illustrated example, the semiconductor substrate 703 of FIG. 11 is an optical chip that includes a plurality of optical waveguides 705A-705N over which a single bar of gain medium material 723 is bonded to create an array of lasers generating a plurality of optical beams 719A-719N in the plurality of optical waveguides 705A-705N, respectively. The plurality of optical beams 719A-719N are modulated by modulators 713A-713N and then selected wavelengths of the plurality of optical beams 719A-719N are then combined in with optical add-drop multiplexer 717 to output a single optical beam 721, which is then to be transmitted through a single optical fiber 753 to an external optical receiver 757.

In an embodiment, at least one of the reflectors 709A-709N is a narrow surface corrugated grating having a grating width less than the waveguide width (passive and/or active depending on the type of laser) in which the grating is formed, as described elsewhere herein. In a particular embodiment, each of the reflectors 709A-709N is a narrow surface corrugated grating, one or more of which has a different width than the others. In another embodiment, multiplexer 717 includes at least one narrow surface corrugated grating having a grating width less than the width of optical waveguides 705A-705N in which the grating is formed, as described elsewhere herein. In other embodiments, any of the reflectors 709A-709N or multiplexer 717 may include an apodized narrow surface-corrugated grating. As such, when any of the reflectors 709A-709N and/or multiplexer 717 are simultaneously fabricated as optical components integrated on semiconductor substrate 703, photolithography may be utilized to image a single photomask including a plurality of gratings, each having a width specified for the particular grating power required for the particular application (e.g., laser, multiplexer filter, etc.).

In one embodiment, the integrated semiconductor modulator multi-wavelength laser is capable of transmitting data at the multiple wavelengths included in the single optical beam 721 over the single optical fiber 753 at speeds of more than 1 Tb/s. In one example, the plurality of optical waveguides 705A-705N are spaced approximately 50-100 μm apart in the single layer over semiconductor substrate 703. Accordingly, in one example, an entire bus of optical data is maybe transmitted from the integrated semiconductor modulator multi-wavelength laser with less than a 4 mm piece of substrate 703.

FIG. 7 also shows that in the example of optical system 751, the single semiconductor substrate 703 may also be coupled to receive an optical beam 721 from an external optical transmitter 759 through an optical fiber 755. Therefore, in the illustrated embodiment, the single semiconductor substrate 703 is an ultra-high capacity transmitter-receiver within a small form factor. While the optical receiver 757 and external optical transmitter 759 are also illustrated as existing on the same chip 761, it is appreciated that external optical receiver 757 and external optical transmitter 759 may be provided on separate chips. In the illustrated embodiment, the received optical beam 722 is received by an optical add/drop demultiplexer 718, which splits the received optical beam 722 into a plurality of optical beams 720A-720N. In one exemplary embodiment, the plurality of optical beams 720A-720N are split according to their respective wavelengths by one or more narrow surface corrugated gratings within the demultiplexer 718 and are then directed through a plurality of optical waveguides 706A-706N disposed in a thin film layer over, on, or in, semiconductor substrate 703.

As shown in the illustrated embodiment, one or more optical detectors are optically coupled to each of the plurality of optical waveguides 706A-706N to detect the respective plurality of optical beams 720A-720N. An array of photodetectors 763A-763N is optically coupled to the plurality of optical waveguides 706A-706N. As one example, each of the photodetectors 763A-763N is a SiGe-based photodetector or the like. In another embodiment, also shown in FIG. 7, a single bar of semiconductor material 724 may be bonded to the a layer over, on, or in substrate 703 across the plurality of optical waveguides 706A-706N to form an array of photodetectors optically coupled to the plurality of optical waveguides 706A-706N. As one example, the single bar of semiconductor material 724 includes III-V semiconductor material to create III-V photodetectors. With SiGe and III-V based photodetectors optically coupled to the plurality of optical waveguides 706A-706N as shown, a variety of wavelengths for the plurality of optical beams 720A-720N may be detected.

Control/pump circuitry may also be included or integrated onto the substrate 703. In one embodiment where the substrate 703 includes a silicon layer (e.g., SOI substrate), control circuit 762 may be integrated directly in the silicon. In one example, the control circuit 762 may be electrically coupled to control, monitor and/or electrically pump any of the lasers in the multi-wavelength laser array 701, the plurality of optical modulators 713A-713N, the arrays of photodetectors (e.g., 763A-713N) or other devices or structures disposed onto substrate 703.

Thus, a narrow surface corrugated grating, method of manufacture and application in optical component integration has been disclosed. Although embodiments of the present invention have been described in language specific to structural features or methodological acts, it is to be understood that the invention defined in the appended claims is not necessarily limited to the specific features or acts described. The specific features and acts disclosed are to be understood merely as particularly graceful implementations of the claimed invention provided in an effort to illustrate rather than limit the present invention.

What is claimed is:

1. A photonic device, comprising:
    a first and second passive semiconductor waveguide region over a substrate; and
    an evanescent semiconductor waveguide region coupled between the first and second passive waveguide regions, wherein one of the passive or evanescent waveguide regions includes a first Bragg reflector comprising a surface corrugated grating with a width narrower than a width of the waveguide region in which the grating is formed, wherein the evanescent waveguide region includes the first Bragg reflector grating and a second Bragg reflector grating to form a DFB laser, and wherein the first and second gratings each comprise a surface corrugated grating having a width narrower than the evanescent waveguide region.

2. The photonic device as in claim 1, wherein the waveguide region including the first Bragg reflector comprises two opposing sidewalls defining the waveguide width at a top surface opposite the substrate; and
    wherein the surface corrugated grating comprises a plurality of grooves formed into the waveguide top surface along a grating length, wherein a width of a majority of the grooves are narrower than the waveguide width by approximately the same amount.

3. The photonic device as in claim 1, wherein the waveguide region including the first Bragg reflector comprises two opposing sidewalls defining the waveguide width at a top surface opposite the substrate; and
    wherein the surface corrugated grating comprises a plurality of teeth formed into the waveguide top surface along a grating length, wherein a majority of the teeth are narrower than the waveguide width by approximately the same amount.

4. The photonic device as in claim 1, wherein the semiconductor comprises silicon and wherein the evanescent waveguide region comprises an electrically pumped light emitting layer disposed over the waveguide.

5. The photonic device of claim 1, wherein the first grating width is different than the second grating width to provide the first grating with a higher grating strength than the second grating.

6. An apparatus comprising a first photonic device as in claim 1; and
    a second photonic device as in claim 1, wherein the first and second photonic devices are integrated onto the same substrate.

7. The apparatus as in claim 6, wherein the first grating width of the first photonic device is different from that of the second photonic device.

8. A system comprising:
    the photonic device of claim 1; and
    an optical modulator coupled to the photonic device to modulate the light generated by the photonic device.

9. The system as in claim 8, wherein the semiconductor waveguide comprises silicon and wherein the grating defines an optical cavity of a hybrid silicon evanescent laser.

10. The system as in claim 9, wherein the grating comprises a plurality of grooves in a top surface of the semiconductor waveguide, and wherein a width of a majority of the grooves is narrower than a width of the waveguide top surface by approximately the same amount.

11. A photonic device, comprising:
    a first and second passive semiconductor waveguide region over a substrate; and
    an evanescent semiconductor waveguide region coupled between the first and second passive waveguide regions, wherein one of the passive or evanescent waveguide regions includes a first Bragg reflector comprising a surface corrugated grating with a width narrower than a width of the waveguide region in which the grating is formed, and wherein the semiconductor comprises silicon, the first Bragg reflector has a mirror length between 5 and 500 µm, the waveguide region including the first Bragg reflector has a width of between approximately 1 and 1.5 µm, and the grating width is less than 90% of the waveguide width.

12. A photonic device, comprising:
    a first and second passive semiconductor waveguide region over a substrate; and an evanescent semiconductor waveguide region coupled between the first and second passive waveguide regions, wherein the first passive waveguide region includes a first Bragg reflector comprising a surface corrugated grating with a first grating width narrower than a width of the first passive waveguide region in which the grating is formed and the second passive waveguide region includes a second Bragg reflector forming a DBR laser, the second Bragg reflector comprising a surface corrugated grating with a second grating width that is narrower than a width of the second passive waveguide region, wherein the first grating width is different than the second grating width to provide the first grating with a higher grating strength than the second grating.

* * * * *